United States Patent
Cho et al.

(10) Patent No.: US 9,419,067 B2
(45) Date of Patent: Aug. 16, 2016

(54) DISPLAY PANEL AND MANUFACTURING METHOD THEREOF

(71) Applicant: EverDisplay Optronics (Shanghai) Limited, Shanghai (CN)

(72) Inventors: Chia-Te Cho, Shanghai (CN); Huan-Hsun Hsieh, Shanghai (CN); Cheng-Pei Huang, Shanghai (CN); Wen-Lung Lu, Shanghai (CN); Wen-Chi Lin, Shanghai (CN)

(73) Assignee: EVERDISPLAY OPTRONICS (SHANGHAI) LIMITED, Shanghai (CN)

( * ) Notice: Subject to any disclaimer, the term of this patent is extended or adjusted under 35 U.S.C. 154(b) by 0 days.

(21) Appl. No.: 14/536,668

(22) Filed: Nov. 9, 2014

(65) Prior Publication Data

US 2016/0043350 A1 Feb. 11, 2016

(30) Foreign Application Priority Data

Aug. 6, 2014 (CN) .......................... 2014 1 0383918

(51) Int. Cl.
*H01L 27/32* (2006.01)
*G02B 5/30* (2006.01)
*H01L 51/00* (2006.01)
*H01L 51/52* (2006.01)

(52) U.S. Cl.
CPC .......... *H01L 27/3281* (2013.01); *G02B 5/3083* (2013.01); *H01L 27/3244* (2013.01); *H01L 51/5281* (2013.01); *H01L 51/0096* (2013.01); *H01L 51/5237* (2013.01); *H01L 2251/558* (2013.01)

(58) Field of Classification Search
CPC .................................................... H01L 27/322
See application file for complete search history.

(56) References Cited

U.S. PATENT DOCUMENTS

| | | | | |
|---|---|---|---|---|
| 5,548,422 A * | 8/1996 | Conner | ................ | G02B 5/3016 349/117 |
| 6,549,335 B1 * | 4/2003 | Trapani | ................ | G02B 5/3033 345/32 |
| 8,259,256 B2 * | 9/2012 | Misono | ............. | G02F 1/133504 349/64 |
| 8,796,704 B2 * | 8/2014 | Hatta | .................. | H01L 27/3213 257/59 |
| 2004/0069985 A1 * | 4/2004 | Cok | ..................... | H01L 51/5281 257/40 |
| 2004/0105059 A1 * | 6/2004 | Ohyama | ........... | G02F 1/133555 349/114 |
| 2005/0213003 A1 * | 9/2005 | Kaneko | ............. | G02F 1/133555 349/114 |
| 2008/0266273 A1 * | 10/2008 | Slobodin | ............. | G02F 1/13338 345/174 |
| 2009/0115933 A1 * | 5/2009 | Mimura | ............ | G02F 1/133512 349/59 |
| 2009/0262286 A1 * | 10/2009 | Nishida | ............. | G02F 1/133555 349/114 |
| 2010/0019668 A1 * | 1/2010 | Koo | .............................. | 313/504 |

(Continued)

FOREIGN PATENT DOCUMENTS

| CN | 101652685 A | 2/2010 |
|---|---|---|
| CN | 102087567 A | 6/2011 |

(Continued)

*Primary Examiner* — Mohammad Islam
*Assistant Examiner* — Ankush Singal
(74) *Attorney, Agent, or Firm* — CKC & Partners Co., Ltd.

(57) ABSTRACT

A display panel includes a first substrate, a second substrate, a quarter wavelength phase retarder, and a linear polarizer. The first substrate has a light emitting element disposed on the first substrate. The opposite panel is disposed opposite to the first substrate. The quarter wavelength phase retarder is disposed between the first substrate and the second substrate. The linear polarize is disposed at a side of the second substrate opposite to the quarter wavelength phase retarder.

6 Claims, 6 Drawing Sheets

(56) References Cited

U.S. PATENT DOCUMENTS

| | | | |
|---|---|---|---|
| 2010/0225864 A1* | 9/2010 | Inoue | G02F 1/133788 349/123 |
| 2011/0121327 A1* | 5/2011 | Lee | G02B 27/2214 257/88 |
| 2012/0280259 A1* | 11/2012 | Hatta | H01L 27/3213 257/89 |
| 2012/0327331 A1* | 12/2012 | Yim | G02F 1/1362 349/62 |
| 2013/0044282 A1* | 2/2013 | Kuwabara | G02F 1/1333 349/96 |
| 2013/0057806 A1* | 3/2013 | Kanemitsu | G02F 1/133603 349/64 |
| 2013/0222711 A1* | 8/2013 | Fang | G02B 27/2214 349/15 |
| 2013/0293794 A1* | 11/2013 | Hsiao et al. | 349/15 |
| 2013/0329288 A1* | 12/2013 | Yim | H01L 51/5281 359/483.01 |
| 2014/0054554 A1* | 2/2014 | Lee | H01L 51/52 257/40 |
| 2014/0104402 A1* | 4/2014 | Gaudreau | G02B 27/26 348/58 |
| 2014/0176880 A1* | 6/2014 | Cho | 349/96 |
| 2015/0009451 A1* | 1/2015 | Zhu et al. | 349/64 |
| 2015/0062496 A1* | 3/2015 | Kang | G02F 1/133528 349/96 |

FOREIGN PATENT DOCUMENTS

| | | |
|---|---|---|
| TW | 201235436 A1 | 9/2012 |
| TW | 201250352 A1 | 12/2012 |

* cited by examiner

DISPLAY PANEL AND MANUFACTURING METHOD THEREOF

RELATED APPLICATIONS

This application claims priority to China Application Serial Number 201410383918.9, filed Aug. 6, 2014, which is herein incorporated by reference.

BACKGROUND

1. Field of Invention

The present invention relates to a display panel.

2. Description of Related Art

In general, the cover substrate of a display panel is made from a glass plate capable of reflecting ambient light. The ambient light may be reflected to human eyes by the display panel to overlap the display images provided by the display panel, such that the ambient light affects the display quality. In this regard, one way to improve the display quality is enhancing the light emitting efficiency of the display panel, which increases the power consuming and reduces the lifetime of the display panel. Alternatively, a circular polarizer can be disposed above the display panel to block the ambient light reflected from the display panel. However, the total thickness of the display panel is accordingly increased. Furthermore, in case the circular polarizer is defectively adhered to the display panel, the reworking of adhesion results in a huge cost.

SUMMARY

An aspect of the present invention is to provide a display panel including a first substrate, a second substrate, a quarter wavelength phase retarder, and a linear polarizer. The first substrate has a light emitting element disposed on the first substrate. The second substrate is disposed opposite to the first substrate. The quarter wavelength phase retarder is disposed between the first substrate and the second substrate. The linear polarizer is disposed at a side of the second substrate opposite to the quarter wavelength phase retarder.

In one or more embodiments, the quarter wavelength phase retarder is made from polymers, and the second substrate is made from glass.

In one or more embodiments, the quarter wavelength phase retarder is a coating layer.

In one or more embodiments, a thickness of the quarter wavelength phase retarder is about 0.01 mm.

In one or more embodiments, the first substrate is an active-matrix organic light emitting diode substrate or a passive-matrix organic light emitting diode substrate.

Another aspect of the present invention is to provide a display panel including a first substrate, a second substrate, a quarter wavelength phase retarder, and a linear polarizer. The first substrate has a light emitting element disposed on the first substrate. The second substrate is disposed opposite to the first substrate, and the second substrate has two main surfaces opposite to each other. The quarter wavelength phase retarder is integrated formed with the second substrate, and is disposed on one of the main surfaces. The linear polarizer is disposed at a side of the second substrate opposite to the first substrate.

In one or more embodiments, the quarter wavelength phase retarder is disposed between the second substrate and the first substrate.

In one or more embodiments, the quarter wavelength phase retarder is disposed between the linear polarizer and the second substrate.

In one or more embodiments, the quarter wavelength phase retarder and the second substrate are made from glass.

In one or more embodiments, the quarter wavelength phase retarder has birefringence property, and the second substrate does not have the birefringence property.

In one or more embodiments, a thickness of the quarter wavelength phase retarder is about 0.01 mm.

In one or more embodiments, the first substrate is an active-matrix organic light emitting diode substrate or a passive-matrix organic light emitting diode substrate.

Another aspect of the present invention is to provide a method for manufacturing a display panel, including forming a light emitting element on a first substrate; forming a quarter wavelength phase retarder on a main surface of a second substrate; assembling the second substrate and a first substrate of the display panel; and adhering a linear polarizer at a side of the second substrate opposite to the first substrate.

In one or more embodiments, forming the quarter wavelength phase retarder includes coating the quarter wavelength phase retarder on the main surface of the second substrate.

In one or more embodiments, the quarter wavelength phase retarder is formed by laser illumination.

In one or more embodiments, the quarter wavelength phase retarder is made from polymers, and the second substrate is made from glass.

In one or more embodiments, the quarter wavelength phase retarder and the second substrate are made from glass.

In one or more embodiments, the quarter wavelength phase retarder has birefringence property, and the second substrate does not have the birefringence property.

In one or more embodiments, assembling the second substrate and the first substrate includes disposing the quarter wavelength phase retarder between the second substrate and the first substrate.

In one or more embodiments, assembling the second substrate and the first substrate includes disposing the second substrate between the quarter wavelength phase retarder and the first substrate.

The display panel can block reflected ambient light, reduce the whole thickness of the display panel, and reduce the reworking cost of adhesion.

DETAILED DESCRIPTION

Reference will now be made in detail to the present embodiments of the invention, examples of which are illustrated in the accompanying drawings. Wherever possible, the

First Embodiment

Figure 1:
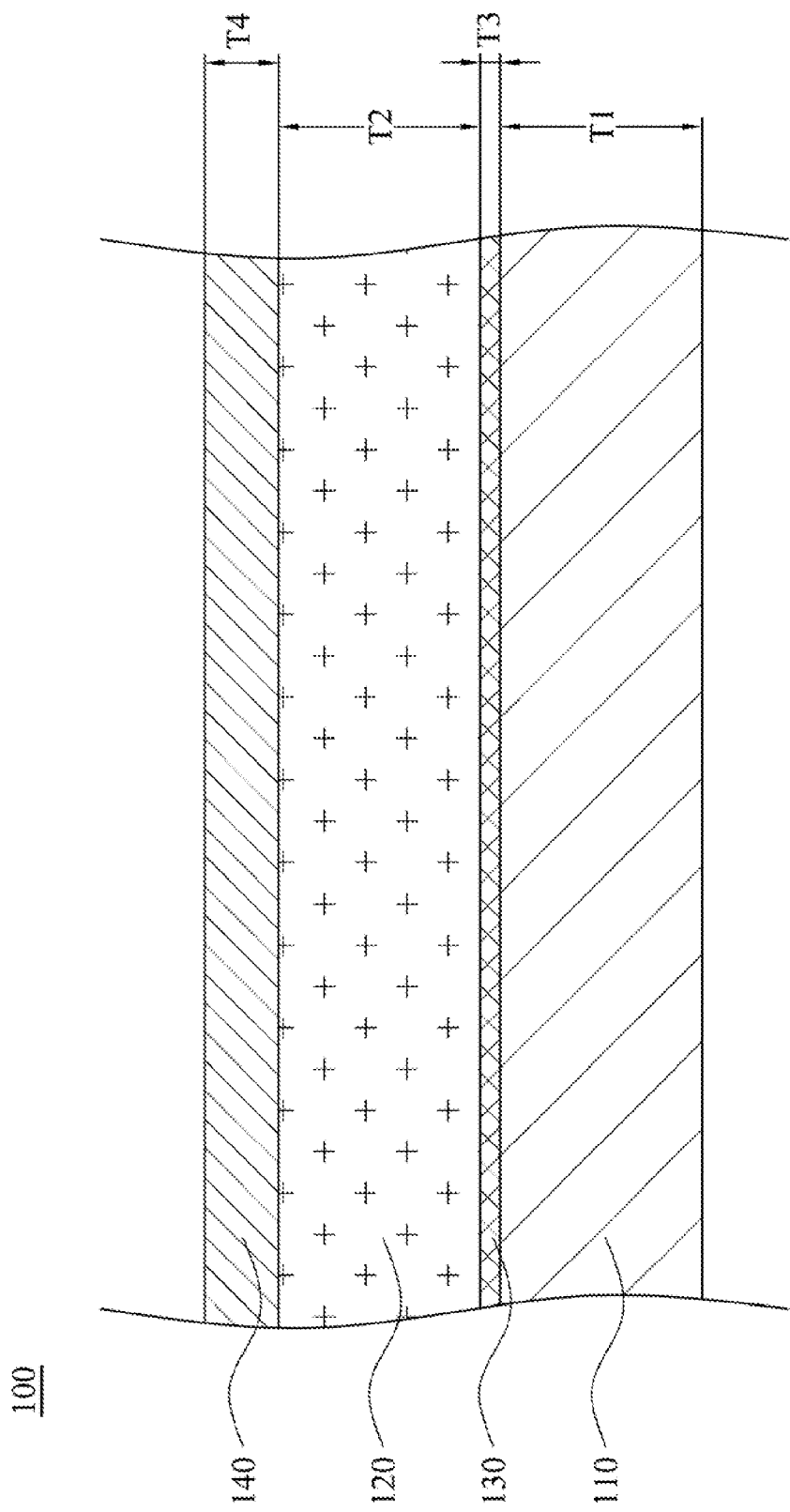
FIG. 1 is a cross-sectional view of a display panel according to a first embodiment of the present invention.

FIG. 1 is a cross-sectional view of a display panel 100 according to a first embodiment of the present invention. The display panel 100 includes a first substrate 110, a second substrate 120, a quarter wavelength phase retarder 130, and a linear polarizer 140. The first substrate 110 has a light emitting element disposed on the first substrate 110. The second substrate 120 is disposed opposite to the first substrate 110. The quarter wavelength phase retarder 130 is disposed between the first substrate 110 and the second substrate 120. The linear polarizer 140 is disposed at a side of the second substrate 120 opposite to the quarter wavelength phase retarder 130.

Briefly, with the quarter wavelength phase retarder 130 and the linear polarizer 140, the display panel 100 in this embodiment can block ambient light. When the ambient light is incident the linear polarizer 140, the ambient light can be filtered to be a first linear polarized light with a specific polarization. Then, the first linear polarized light passes through the second substrate 120 and the quarter wavelength phase retarder 130 in sequence and becomes circularly polarized light. The circularly polarized light is reflected by the first substrate 110, passes again through the quarter wavelength phase retarder 130, and then becomes a second linear polarized light, wherein the polarization of the second linear polarized light is substantially orthogonal to that of the first linear polarized light. Subsequently, the second linear polarized light passes through the second substrate 120 and is incident the linear polarizer 140, thereby is blocked by the linear polarizer 140. Therefore, the display panel 100 of the present embodiment can eliminate the disturbance of the ambient light through the linear polarizer 140 and the quarter wavelength phase retarder 130.

Moreover, the configuration positions of the quarter wavelength phase retarder 130 and the linear polarizer 140 can also reduce the reworking cost of adhesion in assembling the display panel 100. In general, a circular polarizer can be adhered on the second substrate 120 to eliminate ambient light. However, since the adhered circular polarizer need to be scraped under poor adhesion, the adhesion reworking probability of the circular polarizer is high, resulting in raising cost. In contrast, in this embodiment, the quarter wavelength phase retarder 130 is disposed between the second substrate 120 and the first substrate 110, and the second substrate 120 is disposed between the linear polarizer 140 and the quarter wavelength phase retarder 130. Hence, only the linear polarizer 140 is scraped if the linear polarizer 140 is under poor adhesion. Since the price of the linear polarizer 140 is lower than that of the circular polarizer, the reworking cost of adhesion can be reduced.

In this embodiment, the thickness T1 of the first substrate 110 can be about 0.3 mm, the thickness T2 of the second substrate 120 can be about 0.3 mm, the thickness T3 of the quarter wavelength phase retarder 130 can be about 0.01 mm, and the thickness T4 of the linear polarizer 140 can be about 0.08 mm. The quarter wavelength phase retarder 130 may be coated on the second substrate 120. That is, the quarter wavelength phase retarder 130 is a coating layer. The quarter wavelength phase retarder 130 can be made from polymers, such as polyvinyl alcohol, and the second substrate 120 can be made from glass. In this embodiment, the total thickness of the quarter wavelength phase retarder 130 and the linear polarizer 140 is about 0.081 mm. To compare with a general circular polarizer whose thickness is about 0.18 mm, the thickness is reduced about 0.1 mm. That is, such configuration (for example, forming the quarter wavelength phase retarder 130 using coating process) can further reduce the total thickness of the display panel 100, making the display panel 100 lighter and slimmer.

In this embodiment, the first substrate 110 can be an active-matrix organic light emitting diode substrate or a passive-matrix organic light emitting diode substrate, or any other active light emitting substrate.

Figure 2A:
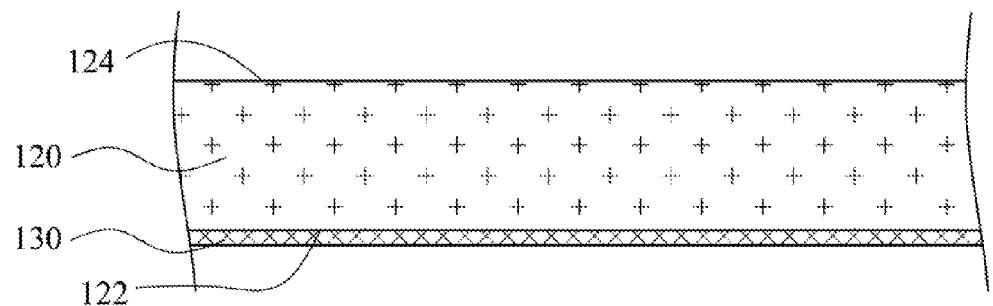
FIGS. 2A to 2C are cross-sectional views of manufacturing the display panel of FIG. 1.
Figure 2B:
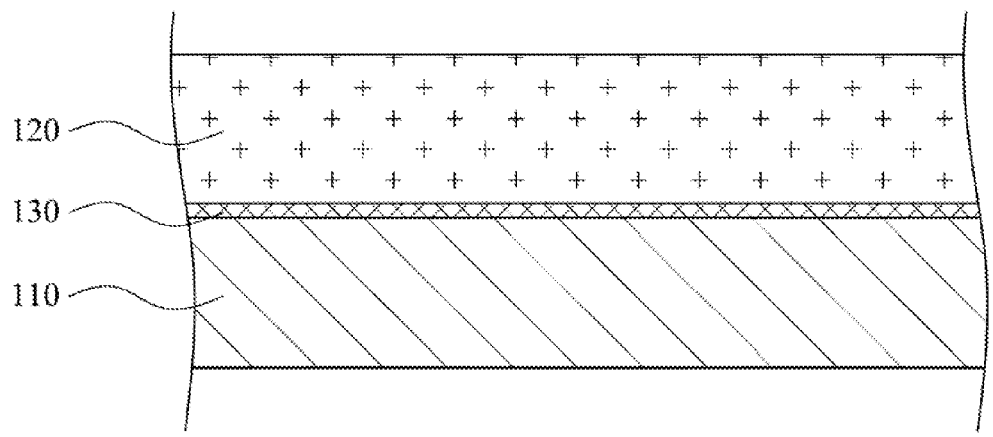
Figure 2C:
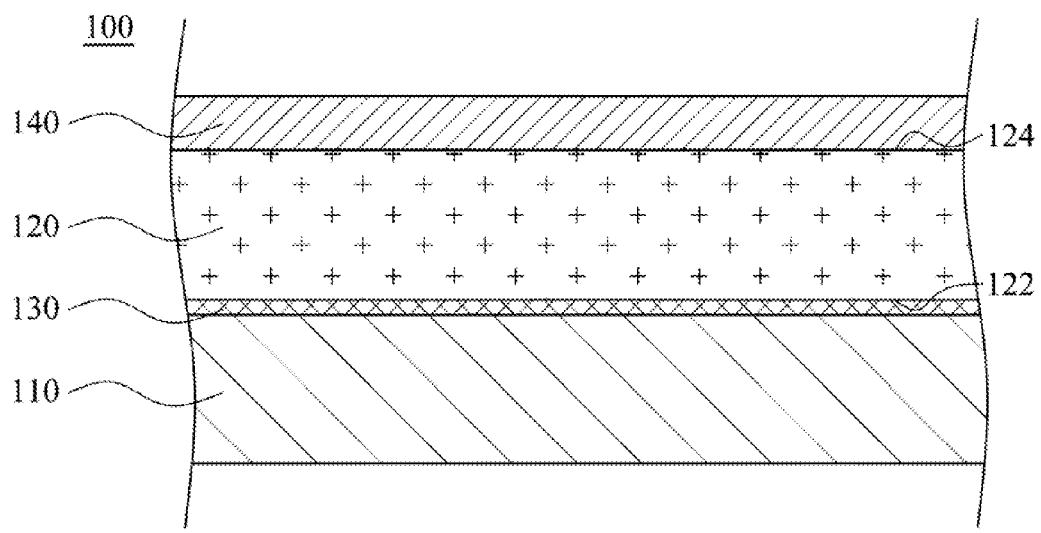

FIGS. 2A to 2C are cross-sectional views of manufacturing the display panel 100 of FIG. 1. Reference is made to FIG. 2A. The quarter wavelength phase retarder 130 can be formed on a main surface 122 of the second substrate 120 first. For example, the quarter wavelength phase retarder 130 can be coated on the main surface 122. In this embodiment, the second substrate 120 can be made from glass.

Reference is made to FIG. 2B. The light emitting element is formed on the first substrate 110. The first substrate 110 and the second substrate 120 can be assembled, such that the quarter wavelength phase retarder 130 is disposed between the first substrate 110 and the second substrate 120. In this embodiment, the first substrate 110 can be an electroluminescent light emitting substrate or other active light emitting substrate.

Reference is made to FIG. 2C. The linear polarizer 140 can be adhered on a main surface 124 of the second substrate 120 opposite to the first substrate 110. As a result, the manufacturing process of the display panel 100 is complete.

In this embodiment, since the display panel 100 includes the quarter wavelength phase retarder 130 and the linear polarizer 140, the display panel 100 can block reflected ambient light. In addition, even though the linear polarizer 140 needs reworking, the cost of the linear polarizer 140 is lower than that of the general circular polarizer. Moreover, since the quarter wavelength phase retarder 130 is coated on the second substrate 120, the total thickness of the display panel 100 can be reduced, resulting in a slimmer and lighter display panel 100.

Second Embodiment

Figure 3:
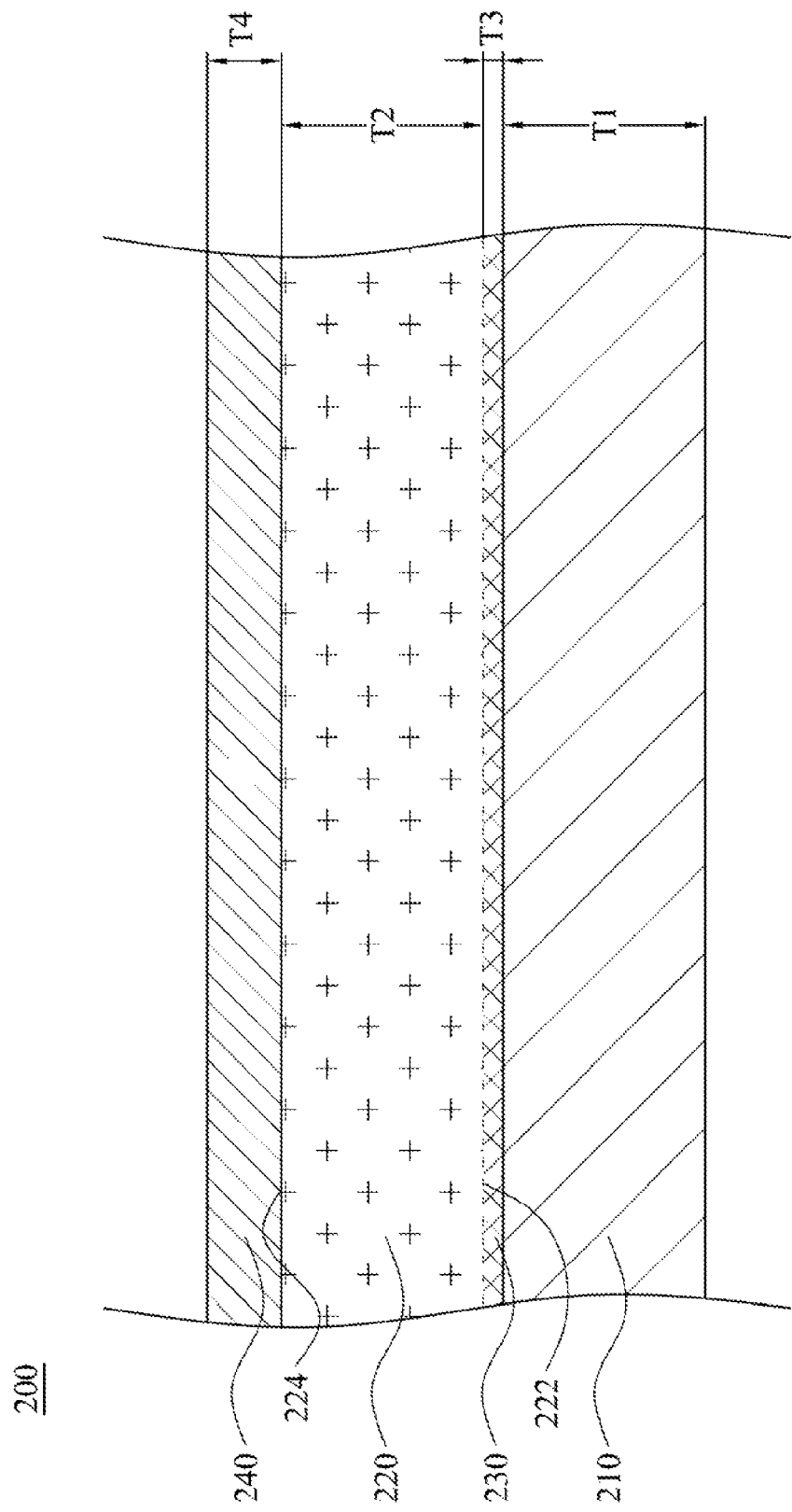
FIG. 3 is a cross-sectional view of a display panel according to a second embodiment of the present invention.

FIG. 3 is a cross-sectional view of a display panel 200 according to a second embodiment of the present invention. The display panel 200 includes a first substrate 210, a second substrate 220, a quarter wavelength phase retarder 230, and a linear polarizer 240. The first substrate 210 has a light emitting element disposed on the first substrate 210. The second substrate 220 is disposed opposite to the first substrate 210, and the second substrate 220 has two main surfaces 222 and 224 opposite to each other. The quarter wavelength phase retarder 230 is integrated formed with the second substrate 220, and is disposed on one of the main surfaces 222 and 224. For example, in FIG. 3, the quarter wavelength phase retarder 230 is disposed on the main surface 222. That is, the quarter wavelength phase retarder 230 is disposed between the second substrate 220 and the first substrate 210. The linear polarizer 240 is disposed at a side of the second substrate 220 opposite to the first substrate 210.

Briefly, with the quarter wavelength phase retarder 230 and the linear polarizer 240, the display panel 200 in this embodiment can block ambient light. When the ambient light is incident the linear polarizer 240, the ambient light can be filtered to be a first linear polarized light with a specific polarization. Then, the first linear polarized light passes through the second substrate 220 and the quarter wavelength phase retarder 230 in sequence and becomes circularly polarized light. The circularly polarized light is reflected by the first substrate 210, passes again through the quarter wavelength phase retarder 230, and then becomes a second linear polarized light, wherein the polarization of the second linear polarized light is substantially orthogonal to that of the first linear polarized light. Subsequently, the second linear polarized light passes through the second substrate 220 and is incident the linear polarizer 240, thereby is blocked by the linear polarizer 240. Therefore, the display panel 200 of the present embodiment can eliminate the disturbance of the ambient light through the linear polarizer 240 and the quarter wavelength phase retarder 230.

Moreover, the configuration positions of the quarter wavelength phase retarder 230 and the linear polarizer 240 can also reduce the reworking cost of adhesion when assembling the display panel 200. In general, a circular polarizer can be adhered on the second substrate 220 to eliminate ambient light. However, since the adhered circular polarizer need to be scraped under poor adhesion, the adhesion reworking probability of the circular polarizer is high, resulting in raising cost. In contrast, in this embodiment, the quarter wavelength phase retarder 230 is disposed between the second substrate 220 and the first substrate 210, and the second substrate 220 is disposed between the linear polarizer 240 and the quarter wavelength phase retarder 230. Hence, only the linear polarizer 240 is scraped if the linear polarizer 240 is under poor adhesion. Since the price of the linear polarizer 240 is lower than that of the circular polarizer, the reworking cost of adhesion can be reduced.

In this embodiment, the thickness T1 of the first substrate 210 can be about 0.3 mm, the thickness T2 of the second substrate 220 can be about 0.3 mm, the thickness T3 of the quarter wavelength phase retarder 230 can be about 0.01 mm, and the thickness T4 of the linear polarizer 240 can be about 0.08 mm. The quarter wavelength phase retarder 230 may be form on the main surface 222 of the second substrate 220 with laser illumination, such that the stress distributions between the quarter wavelength phase retarder 230 and the second substrate 220 are different. Hence, the quarter wavelength phase retarder 230 has birefringence property, and the second substrate 220 does not have the birefringence property. In this embodiment, the total thickness of the quarter wavelength phase retarder 230 and the linear polarizer 240 is about 0.081 mm. To compare with a general circular polarizer whose thickness is about 0.18 mm, the thickness is reduced about 0.1 mm. That is, such configuration (for example, forming the quarter wavelength phase retarder 230 using laser illumination) can further reduce the total thickness of the display panel 200, making the display panel 200 lighter and slimmer.

In this embodiment, the first substrate 210 can be an active-matrix organic light emitting diode substrate or a passive-matrix organic light emitting diode substrate, or any other active light emitting substrate. Moreover, both of the second substrate 220 and the quarter wavelength phase retarder 230 can be made from glass.

Figure 4A:
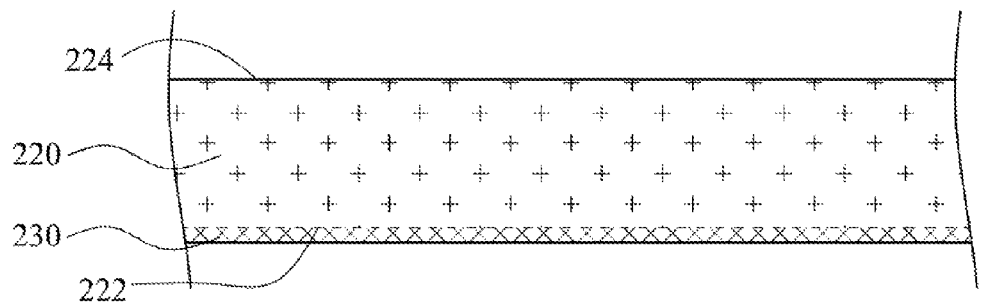
FIGS. 4A to 4C are cross-sectional views of manufacturing the display panel of FIG. 3.
Figure 4B:
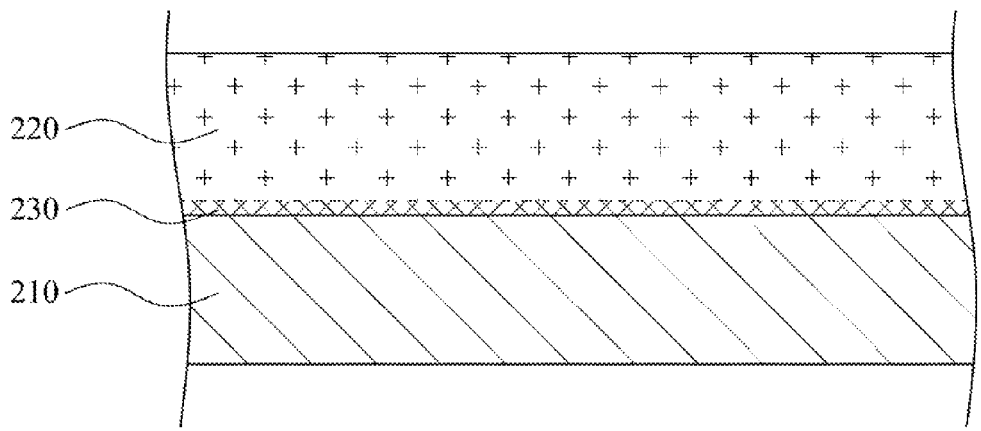
Figure 4C:
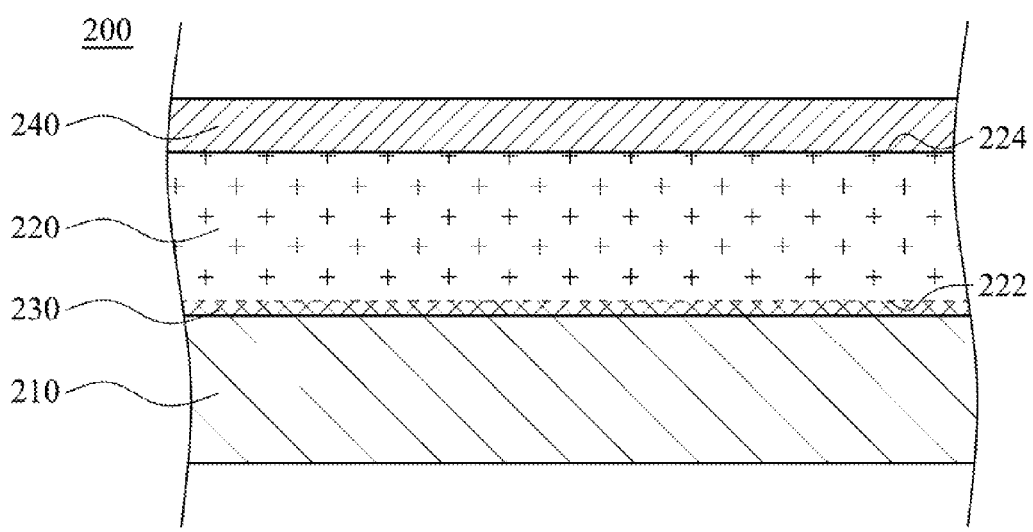

FIGS. 4A to 4C are cross-sectional views of manufacturing the display panel 200 of FIG. 3. Reference is made to FIG. 4A. The quarter wavelength phase retarder 230 can be formed on a main surface 222 of the second substrate 220 first with, for example, laser illumination. For instance, a laser beam can be focused on the main surface 222 of the second substrate 220, such that the stress distribution of the material around the main surface 222 changes to form the quarter wavelength phase retarder 230. In this embodiment, the second substrate 220 can be made from glass. That is, the quarter wavelength phase retarder 230 is also made from glass.

Reference is made to FIG. 4B. The light emitting element is formed on the first substrate 210. The first substrate 210 and the second substrate 220 can be assembled, such that the quarter wavelength phase retarder 230 is disposed between the first substrate 210 and the second substrate 220. In this embodiment, the first substrate 210 can be an electroluminescent light emitting substrate or other active light emitting substrate.

Reference is made to FIG. 4C. The linear polarizer 240 can be adhered on a main surface 224 of the second substrate 220 opposite to the first substrate 210. As a result, the manufacturing process of the display panel 200 is complete.

In this embodiment, since the display panel 200 includes the quarter wavelength phase retarder 230 and the linear polarizer 240, the display panel 200 can block reflected ambient light. In addition, even though the linear polarizer 240 may rework adhesion, the scrap cost of the linear polarizer 240 is lower than that of the general circular polarizer. Moreover, since the quarter wavelength phase retarder 230 is formed on the second substrate 220 using laser illumination, the total thickness of the display panel 200 can be reduced, resulting in a slimmer and lighter display panel 200.

Third Embodiment

Figure 5:
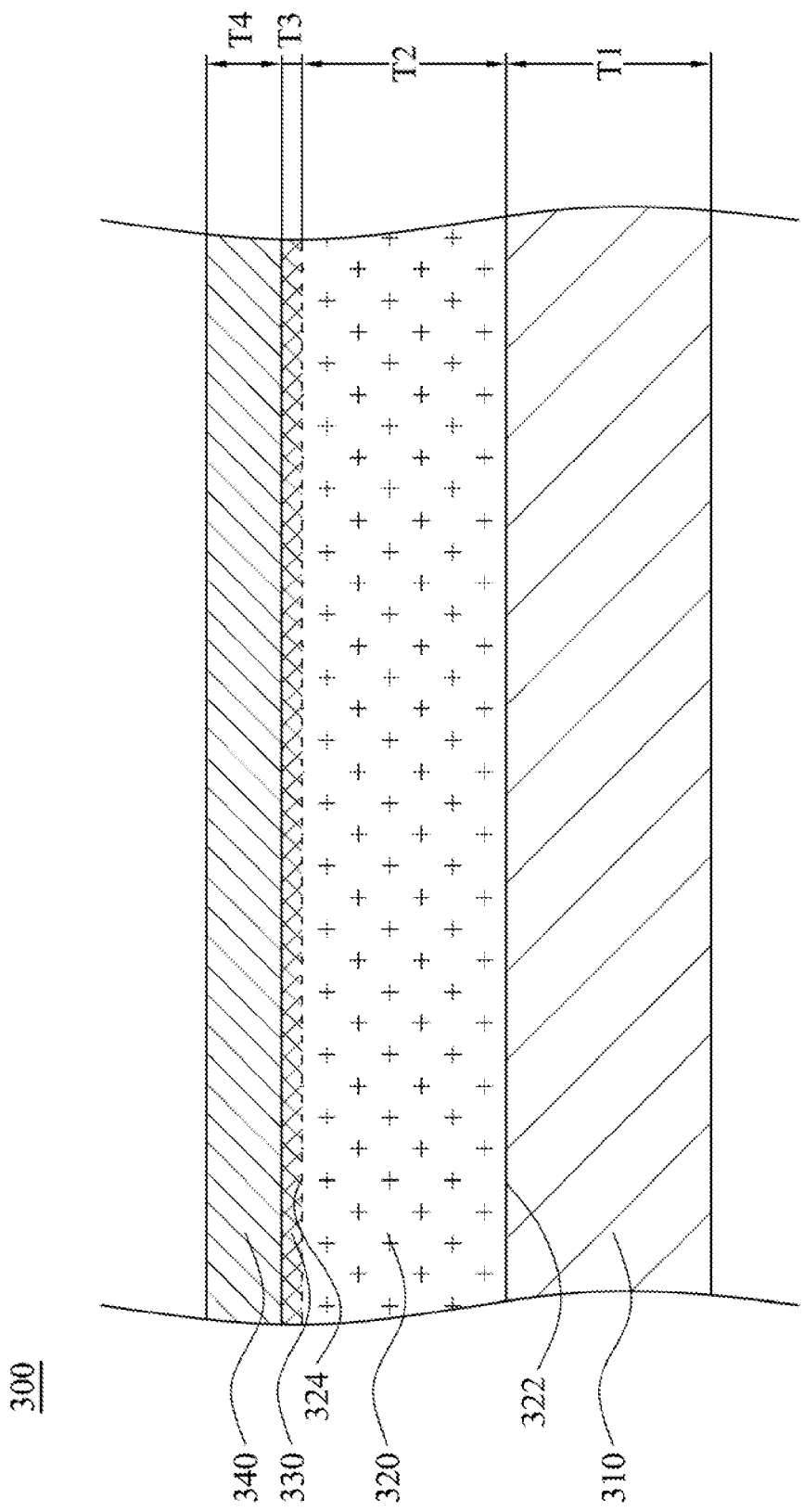
FIG. 5 is a cross-sectional view of a display panel according to a third embodiment of the present invention.

FIG. 5 is a cross-sectional view of a display panel 300 according to a third embodiment of the present invention. The display panel 300 includes a first substrate 310, a second substrate 320, a quarter wavelength phase retarder 330, and a linear polarizer 340. The first substrate 310 has a light emitting element disposed on the first substrate 310. The second substrate 320 is disposed opposite to the first substrate 310, and the second substrate 320 has two main surfaces 322 and 324 opposite to each other. The quarter wavelength phase retarder 330 is integrated formed with the second substrate 320, and is disposed on one of the main surfaces 322 and 324. For example, in FIG. 5, the quarter wavelength phase retarder 330 is disposed on the main surface 324. That is, the quarter wavelength phase retarder 330 is disposed between the linear polarizer 340 and the second substrate 320. The linear polarizer 340 is disposed at a side of the second substrate 320 opposite to the first substrate 310.

Briefly, with the quarter wavelength phase retarder 330 and the linear polarizer 340, the display panel 300 in this embodiment can block ambient light. When the ambient light is incident the linear polarizer 340, the ambient light can be filtered to be a first linear polarized light with a specific polarization. Then, the first linear polarized light passes through the quarter wavelength phase retarder 330 and becomes circularly polarized light. The circularly polarized light is reflected by the second substrate 320 and passes through the quarter wavelength phase retarder 330 again, thus becomes a second linear polarized light, wherein the polarization of the second linear polarized light is substantially orthogonal to that of the first linear polarized light. Subsequently, the second linear polarized light is back to the linear polarizer 340, thereby is blocked by the linear polarizer 340. Therefore, the display panel 300 of the present embodiment can eliminate the disturbance of the ambient light through the linear polarizer 340 and the quarter wavelength phase retarder 330.

Moreover, the configuration positions of the quarter wavelength phase retarder 330 and the linear polarizer 340 can also reduce the reworking cost of adhesion when assembling the display panel 300. In general, a circular polarizer can be adhered on the second substrate 320 to eliminate ambient light. However, since the adhered circular polarizer need to be scraped under poor adhesion, the adhesion reworking probability of the circular polarizer is high, resulting in raising cost. In contrast, in this embodiment, since the quarter wavelength phase retarder 330 and the second substrate 220 are integrally formed, only the linear polarizer 340 is scraped other than the quarter wavelength phase retarder 330 if the linear polarizer 340 is under poor adhesion. Since the price of the linear polarizer 340 is lower than that of the circular polarizer, the reworking cost of adhesion can be reduced.

In this embodiment, the thickness T1 of the first substrate 310 can be about 0.3 mm, the thickness T2 of the second substrate 320 can be about 0.3 mm, the thickness T3 of the quarter wavelength phase retarder 330 can be about 0.01 mm, and the thickness T4 of the linear polarizer 340 can be about 0.08 mm. The quarter wavelength phase retarder 330 may be form on the main surface 324 of the second substrate 320 with laser illumination, such that the stress distributions between the quarter wavelength phase retarder 330 and the second substrate 320 are different. Hence, the quarter wavelength phase retarder 330 has birefringence property, and the second substrate 320 does not have the birefringence property. In this embodiment, the total thickness of the quarter wavelength phase retarder 330 and the linear polarizer 340 is about 0.081 mm. To compare with a general circular polarizer whose thickness is about 0.18 mm, the thickness is reduced about 0.1 mm. That is, such configuration (for example, forming the quarter wavelength phase retarder 330 using laser illumination) can further reduce the total thickness of the display panel 300, making the display panel 300 lighter and slimmer.

In this embodiment, the first substrate 310 can be an active-matrix organic light emitting diode substrate or a passive-matrix organic light emitting diode substrate, or any other active light emitting substrate. Moreover, both of the second substrate 320 and the quarter wavelength phase retarder 330 can be made from glass.

Figure 6A:
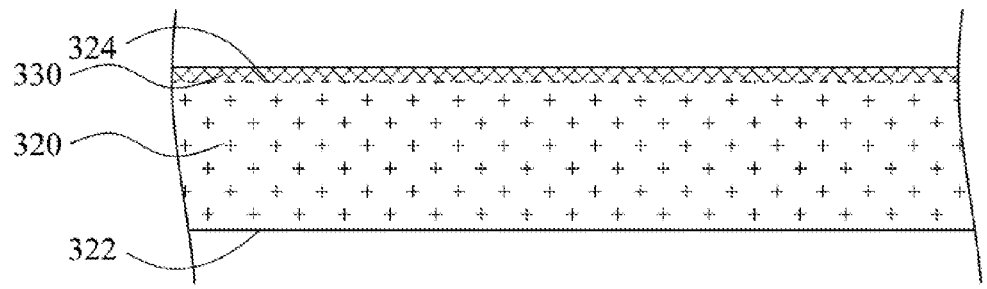
FIGS. 6A to 6C are cross-sectional views of manufacturing the display panel of FIG. 1.
Figure 6B:
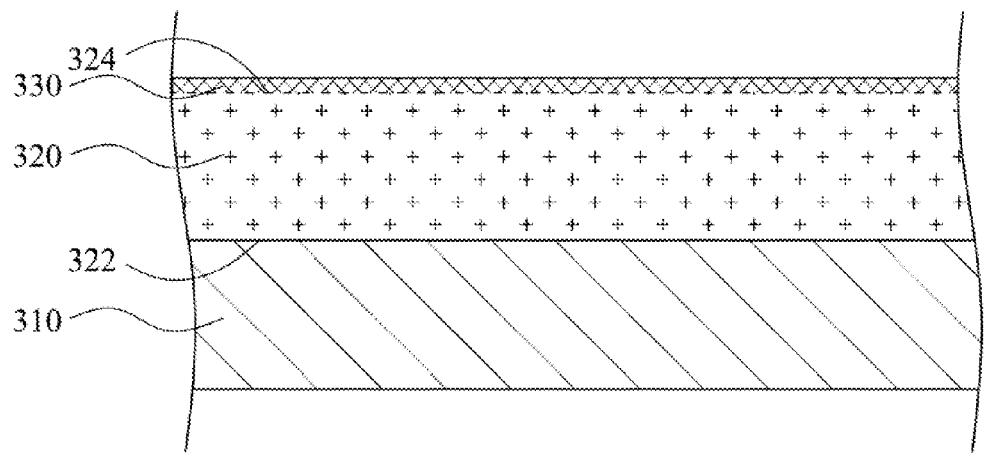
Figure 6C:
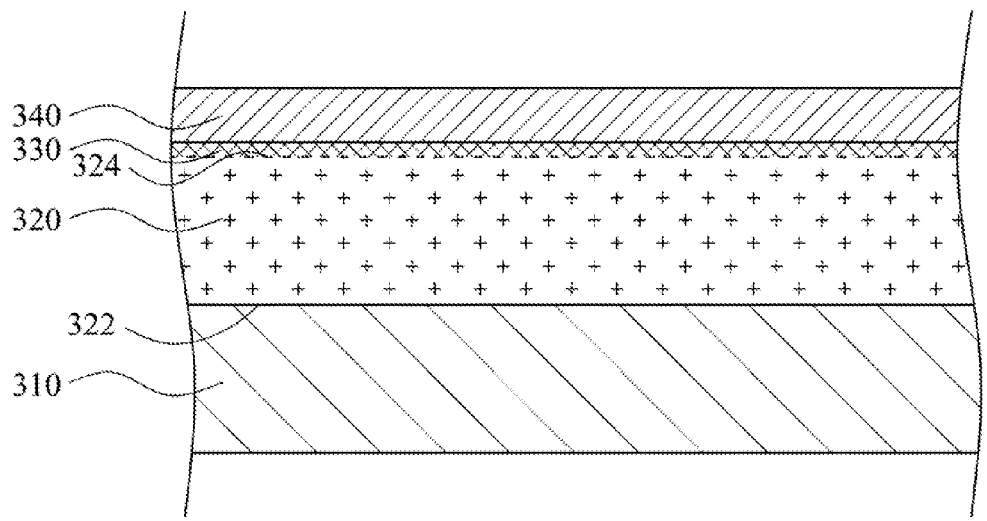

FIGS. 6A to 6C are cross-sectional views of manufacturing the display panel 300 of FIG. 5. Reference is made to FIG. 6A. The quarter wavelength phase retarder 330 can be formed on the main surface 324 of the second substrate 320 first with, for example, laser illumination. For instance, a laser beam can be focused on the main surface 324 of the second substrate 320, such that the stress distribution of the material around the main surface 324 changes to form the quarter wavelength phase retarder 330. In this embodiment, the second substrate 320 can be made from glass. That is, the quarter wavelength phase retarder 330 is also made from glass.

Reference is made to FIG. 6B. The light emitting element is formed on the first substrate 310. The first substrate 310 and the second substrate 320 can be assembled, such that the second substrate 320 is disposed between the first substrate 310 and the quarter wavelength phase retarder 330. In this embodiment, the first substrate 310 can be an electroluminescent light emitting substrate or other active light emitting substrate.

Reference is made to FIG. 6C. The linear polarizer 340 can be adhered above the main surface 324 of the second substrate 320 opposite to the first substrate 310, that is, on the quarter wavelength phase retarder 330. As a result, the manufacturing process of the display panel 300 is complete.

In this embodiment, since the display panel 300 includes the quarter wavelength phase retarder 330 and the linear polarizer 340, the display panel 300 can block reflected ambient light. In addition, even though the linear polarizer 340 may rework adhesion, the scrap cost of the linear polarizer 340 is lower than that of the general circular polarizer. Moreover, since the quarter wavelength phase retarder 330 is formed on the second substrate 320 using laser illumination, the total thickness of the display panel 300 can be reduced, resulting in a slimmer and lighter display panel 300.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A display panel, comprising:
    a first substrate having a light emitting element disposed on said first substrate;
    a second substrate disposed opposite to the first substrate, and the second substrate having two main surfaces opposite to each other;
    a quarter wavelength phase retarder integrated formed with the second substrate, and disposed on one of the main surfaces, wherein the quarter wavelength phase retarder has birefringence property, and the second substrate does not have the birefringence property; and
    a linear polarizer, wherein the second substrate is present between the linear polarizer and the first substrate.

2. The display panel of claim 1, wherein the quarter wavelength phase retarder is disposed between the second substrate and the first substrate.

3. The display panel of claim 1, wherein the quarter wavelength phase retarder is disposed between the linear polarizer and the second substrate.

4. The display panel of claim 1, wherein the quarter wavelength phase retarder and the second substrate are made from glass.

5. The display panel of claim 1, wherein a thickness of the quarter wavelength phase retarder is about 0.01 mm.

6. The display panel of claim 1, wherein the first substrate is an active-matrix organic light emitting diode substrate or a passive-matrix organic light emitting diode substrate.

* * * * *